US011205887B2

(12) United States Patent
Hashimoto et al.

(10) Patent No.: US 11,205,887 B2
(45) Date of Patent: Dec. 21, 2021

(54) QUANTUM CASCADE LASER AND METHOD FOR MANUFACTURING SAME

(71) Applicant: KABUSHIKI KAISHA TOSHIBA, Minato-ku (JP)

(72) Inventors: Rei Hashimoto, Edogawa (JP); Shinji Saito, Yokohama (JP); Tomohiro Takase, Sagamihara (JP); Tsutomu Kakuno, Fujisawa (JP); Yuichiro Yamamoto, Yokohama (JP); Kei Kaneko, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 177 days.

(21) Appl. No.: 16/701,217

(22) Filed: Dec. 3, 2019

(65) Prior Publication Data
US 2020/0176953 A1    Jun. 4, 2020

(30) Foreign Application Priority Data

Dec. 4, 2018    (JP) .............................. JP2018-227481

(51) Int. Cl.
*H01S 5/343*    (2006.01)
*B82Y 20/00*    (2011.01)
*H01S 5/02*    (2006.01)

(52) U.S. Cl.
CPC .............. *H01S 5/343* (2013.01); *B82Y 20/00* (2013.01); *H01S 5/0206* (2013.01); *H01S 2301/166* (2013.01)

(58) Field of Classification Search
CPC .. H01S 5/3401; H01S 5/0287; H01S 5/34346; H01S 5/2215; H01S 5/3407; H01S 5/221; H01S 5/0206; H01S 5/068; H01S 5/02; H01S 5/3402

USPC ........................................ 372/43.01; 359/332
See application file for complete search history.

(56) References Cited

U.S. PATENT DOCUMENTS

| 8,993,999 | B2* | 3/2015 | Takagi | .................. H01S 5/2206 257/13 |
| 9,991,677 | B2* | 6/2018 | Briggs | .................... H01S 5/125 |
| 2003/0012242 | A1* | 1/2003 | Iwai | ..................... H01S 5/18313 372/46.013 |
| 2004/0228380 | A1* | 11/2004 | Kuromizu | ............. B82Y 20/00 372/45.01 |

(Continued)

FOREIGN PATENT DOCUMENTS

| JP | 2001-203426 A | 7/2001 |
| JP | 2003-37336 A | 2/2003 |

(Continued)

*Primary Examiner* — Tuan N Nguyen
(74) *Attorney, Agent, or Firm* — Oblon, McClelland, Maier & Neustadt, L.L.P.

(57) ABSTRACT

A quantum cascade laser of an embodiment includes a semiconductor stacked body in which a ridge waveguide is provided. The semiconductor stacked body includes an active layer including a quantum well region including a layer including Al; and the active layer emits laser light. The layer that includes Al includes first regions, and a second region interposed between the first regions; the first region includes Al oxide and reaches a prescribed depth inward from an outer edge of the active layer along a direction parallel to a surface of the active layer in a cross section orthogonal to the optical axis; and the second region does not include Al oxide.

6 Claims, 7 Drawing Sheets

(56) References Cited

U.S. PATENT DOCUMENTS

2019/0148915 A1   5/2019  Saito et al.

FOREIGN PATENT DOCUMENTS

| JP | 2004-335964 A | 11/2004 |
| JP | 2017-168591 A | 9/2017 |
| JP | 2019-91839 A | 6/2019 |

* cited by examiner

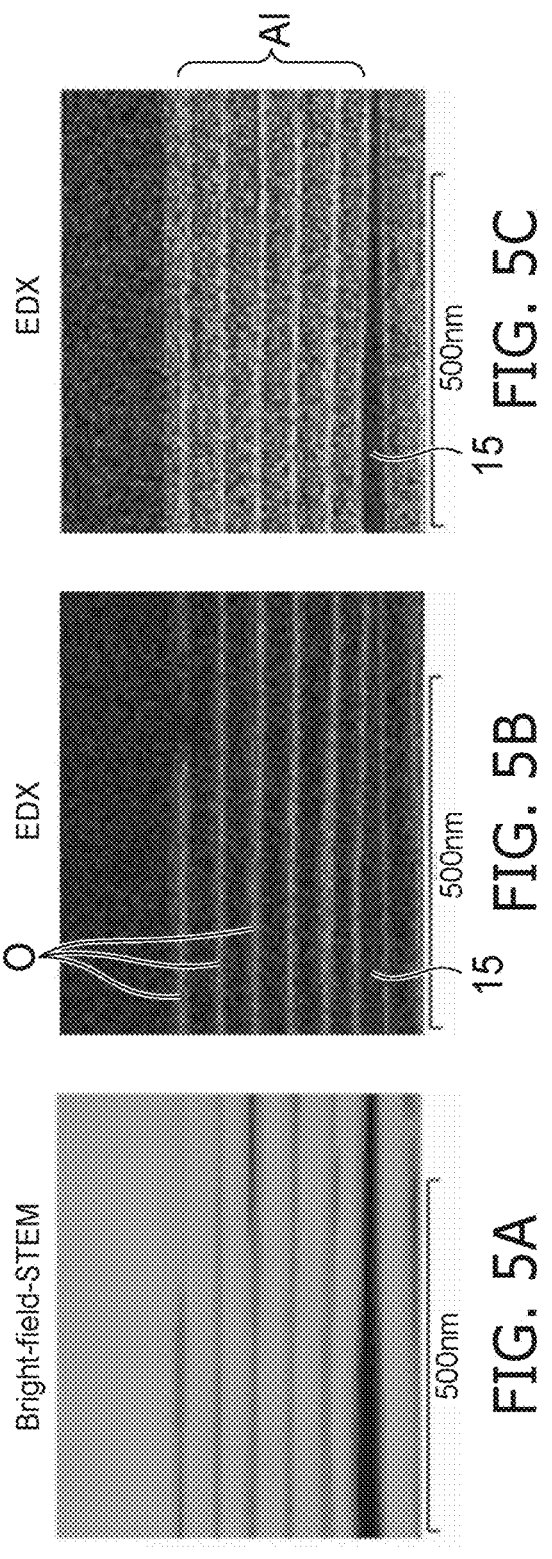
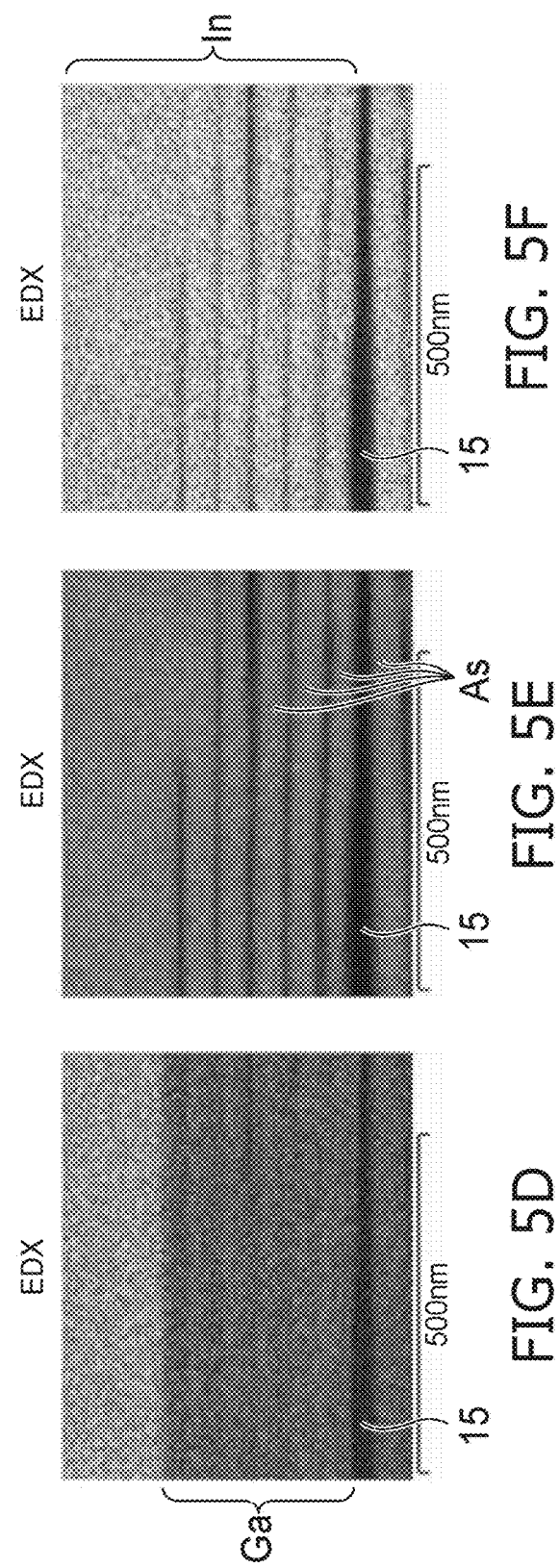

QUANTUM CASCADE LASER AND METHOD FOR MANUFACTURING SAME

CROSS-REFERENCE TO RELATED APPLICATIONS

This application is based upon and claims the benefit of priority from Japanese Patent Application No. 2018-227481, filed on Dec. 4, 2018; the entire contents of which are incorporated herein by reference.

FIELD

Embodiments described herein relate generally to a quantum cascade laser and a method for manufacturing same.

BACKGROUND

In a ridge-waveguide semiconductor laser, lateral-mode control can be easy and the threshold current can be reduced by setting the ridge waveguide width to be narrow.

For example, an InP-based material can be used when the semiconductor laser is a quantum cascade laser capable of emitting infrared light. However, InP-based materials are fragile; and it is difficult to form a narrow ridge waveguide with high yield.

BRIEF DESCRIPTION OF THE DRAWINGS

FIG. 5A is a Bright-field-STEM photograph of the cross section, FIG. 5B is a figure showing oxygen analysis using EDX, FIG. 5C is a figure showing Al analysis using EDX, FIG. 5D is a figure illustrating Ga analysis using EDX, FIG. 5E is a figure illustrating As analysis using EDX, and FIG. 5F is a figure illustrating In analysis using EDX;

DETAILED DESCRIPTION

A quantum cascade laser of an embodiment includes a semiconductor stacked body in which a ridge waveguide is provided.

The semiconductor stacked body includes an active layer including a quantum well region including a layer including Al; and the active layer emits laser light by an intersubband optical transition of a mono-carrier. The layer that includes Al includes first regions, and a second region interposed between the first regions; the first region includes Al oxide and reaches a prescribed depth inward from an outer edge of the active layer along a direction parallel to a surface of the active layer in a cross section orthogonal to the optical axis; and the second region does not include Al oxide.

Embodiments of the invention will now be described with reference to the drawings.

Figure 1:
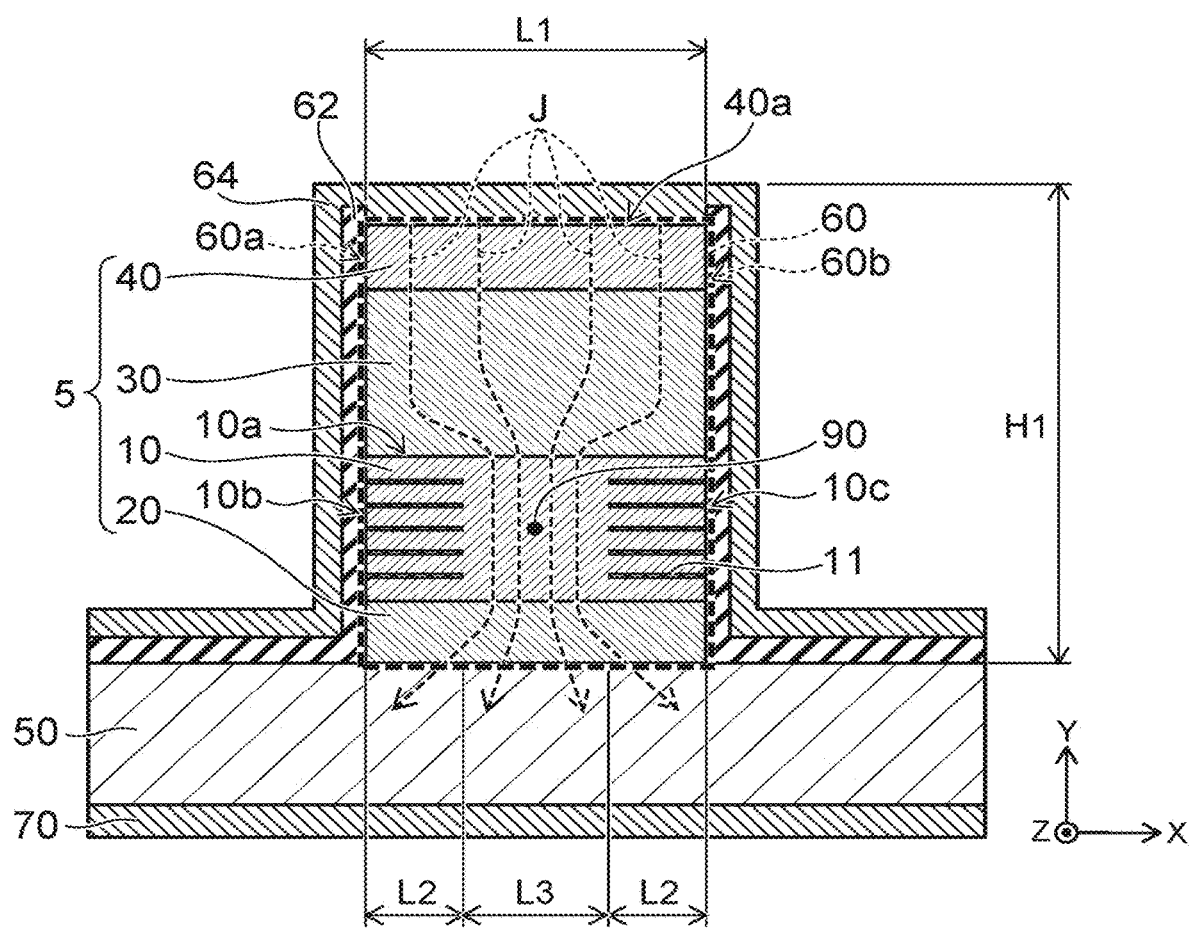
FIG. 1 is a schematic cross-sectional view of a quantum cascade laser according to a first embodiment.

FIG. 1 is a schematic cross-sectional view of a quantum cascade laser according to a first embodiment.

Figure 2:
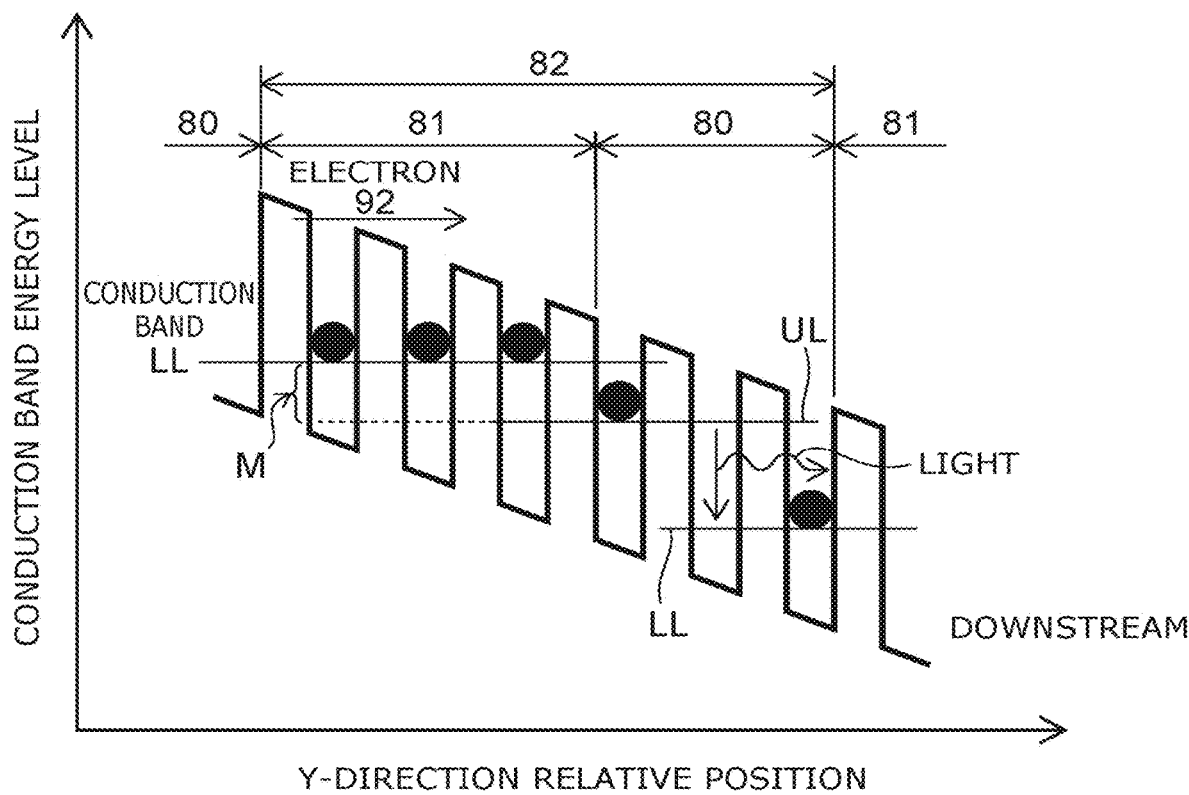
FIG. 2 is a conduction band energy level diagram for the Y-direction relative position of the quantum cascade laser according to the first embodiment.

FIG. 2 is a conduction band energy level diagram for the Y-direction relative position of the quantum cascade laser according to the first embodiment.

FIG. 1 is a schematic cross-sectional view perpendicular to a Z-axis. The quantum cascade laser includes a semiconductor stacked body 5. The semiconductor stacked body 5 includes an active layer 10. The active layer 10 includes a quantum well region including a layer including Al, and emits laser light by an intersubband optical transition of a mono-carrier. A ridge waveguide 60 also is provided in the semiconductor stacked body 5.

An optical axis 90 of the laser light is parallel to the direction (the Z-axis) in which the ridge waveguide 60 extends. The layer that includes Al includes first regions 11 that include Al oxide layers reaching a prescribed depth L2 inward from outer edges 10b and 10c of the active layer 10 along a direction parallel to a front surface 10a of the active layer 10 in a cross section (the surface of the page) orthogonal to the optical axis 90, and a second region that is interposed between the first regions 11 and does not include an Al oxide layer. The mono-carrier is taken to be an electron in the drawing.

The ridge waveguide 60 is included in an optical resonator. As a result, the laser light is emitted along the optical axis 90 from at least one of the two end surfaces of the ridge waveguide 60.

As illustrated in FIG. 1, the semiconductor stacked body 5 may further include a lower cladding layer 20, an upper cladding layer 30, a contact layer 40, etc. The semiconductor stacked body 5 is patterned into a desired ridge width L1 by photolithography and dry etching, etc., after performing crystal growth on a substrate 50.

An insulating film 62 is provided on side surfaces 60a and 60b of the ridge waveguide 60 and on the surface of the substrate 50 where the ridge waveguide is not provided. The insulating film 62 may be $SiO_x$, etc. An upper electrode 64 is provided on an upper surface 40a of the contact layer 40 and the upper portion of the insulating film 62; and a back electrode 70 is provided on the back surface of the substrate 50.

A portion of the layer including Al oxide provided in the quantum well region inside the active layer 10 is used as a confinement layer for a current J between the upper electrode 64 and the back electrode 70. As a result, an effective ridge width L3 can be set to be narrower than the ridge width L1.

FIG. 2 is a conduction band energy level diagram for the Y-direction relative position of the quantum cascade laser according to the first embodiment.

One period of the cascade includes a pair of a light-emitting quantum well region 80 and an injection quantum well region 81; and the active layer 10 is formed by repeatedly stacking, for example, 30 to 100 periods in the Y-axis direction. As a result, the mono-carrier (in this case, an electron) that undergoes an intersubband optical transition in one period repeats optical transitions for the number of stacks. Therefore, a ridge height H1 is large and is, for example, 8 μm or the like.

In the light-emitting quantum well region 80, an electron 92 which is the carrier undergoes an intersubband optical transition between an upper level UL and a lower level LL formed in the conduction band. The light emission wavelength corresponds to the energy difference (UL−LL=hv). The electron 92 is transported to the injection quantum well region 81 downstream and relaxes to an energy level lower than a mini-band M. The relaxed energy level is inherited by the light-emitting quantum well region further downstream, again becomes the upper level UL, and an intersubband optical transition occurs again. In other words, the quantum cascade laser has a different structure and emits light using a principle different from that of a p-n junction-type laser that emits light of a wavelength corresponding to a bandgap energy Eg due to electrons of the conduction band recombining with holes of the valence band.

When the light emission wavelength is in the mid- to far-infrared range, for example, the semiconductor material can be an InP-based material. The light-emitting quantum well region can be $In_{0.67}Ga_{0.33}As$ (well layer)/$In_{0.33}Al_{0.67}As$ (barrier layer), etc. The injection quantum well region 81 can be $In_{0.67}Ga_{0.33}As$ (well layer)/$In_{0.67}Al_{0.33}As$ (barrier layer), etc. $In_{0.67}Ga_{0.33}As$ is used as the well layer and $In_{0.33}Al_{0.67}As$ is used as the barrier layer because the bandgap energy of $In_{0.67}Ga_{0.33}As$ is smaller than the bandgap energy of $In_{0.33}Al_{0.67}As$.

Also, the lower cladding layer 20 and the upper cladding layer 30 each can be InP, etc. The contact layer 40 can be InGaAs, etc. The substrate 50 can be n-type InP, etc.

Figure 3:
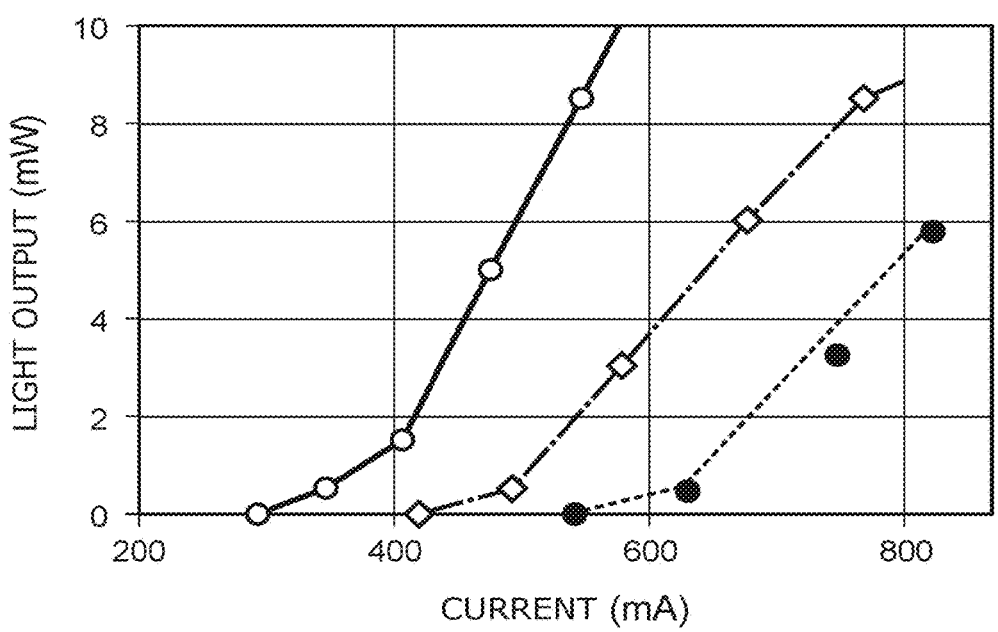
FIG. 3 is a graph illustrating the light output dependence for the operating current.

FIG. 3 is a graph illustrating the light output dependence for the operating current.

The vertical axis is the light output (mW); and the horizontal axis is the operating current (mA). The solid line is an example of the first embodiment in which the ridge width L1 is 12 μm, a width L2 of the first region 11 including the Al oxide layer is 3 μm, and the effective ridge width is 6 μm. The broken line is a first comparative example in which the ridge width L1 is 12 μm, and an Al oxide layer is not formed. The single dot-dash line is a second comparative example in which the ridge width L1 is 9 μm, and an Al oxide layer is not formed.

In the first comparative example, the current is not confined because an Al oxide layer is not provided. Therefore, the effective ridge width remains wide, i.e., 12 μm; the current density and the light density are low; and the threshold current is high, i.e., about 520 mA. In the second comparative example, the current is not confined because an Al oxide layer is not provided; however, because the ridge width L1 is narrow, i.e., 9 μm, the threshold current is about 410 mA and is reduced. However, it cannot be said that the threshold of the second comparative example is sufficiently low. Conversely, in the first embodiment, the effective ridge width L3 is about 6 because the width (the prescribed depth L2) of the first region 11 including the Al oxide layer is 3 μm. Therefore, the threshold current is reduced to about 290 mA; and a higher light output is possible.

The limit of patterning the ridge width L1 to be narrow in the quantum cascade laser will now be described. First, to realize a low threshold and lateral-mode control of the laser light, it is favorable to set the ridge width L1 to be narrow, i.e., 2 to 6 μm or the like. However, to increase the output of the quantum cascade laser, it is necessary to increase the number of stacks of the pairs of the light-emitting quantum well region 80 and the injection quantum well region 81 to 30 to 100 periods or the like. Therefore, the ridge height H1 becomes large, i.e., 8 μm or the like; the process of forming a ridge waveguide that is slender in the vertical direction by photolithography and dry etching is not easy; and the manufacturing yield decreases. In a quantum cascade laser configured to emit mid- to far-infrared light, normally, a material that includes InP is used in the substrate 50, the cladding layers 20 and 30, etc. In such a case, if a ridge that is 6 μm or less is formed, the ridge waveguide is damaged easily due to the mechanical fragility of InP.

Conversely, in the first embodiment, the ridge width L1 can be set to 6 to 14 μm or the like; and the ratio (L1/H1) of the width to the ridge height H1 can be large, i.e., 0.75 to 1.75 or the like. Therefore, even for a material including InP, the damage of the ridge waveguide 60 can be suppressed; and the ridge waveguide 60 can be formed with high yield. Also, the first region 11 that includes Al oxide can be formed with good control to the prescribed depth L2; and the effective ridge width L3 can be 6 μm or less.

Figure 4:
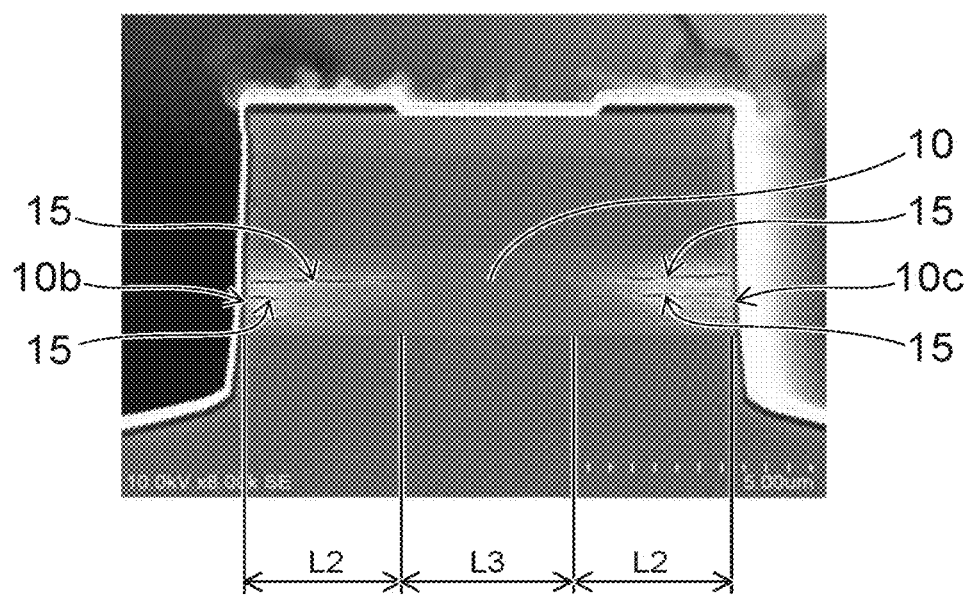
FIG. 4 is a SEM (Scanning Electron Microscope) photograph of a cross section of the ridge waveguide of the quantum cascade laser according to the first embodiment.

FIG. 4 is a SEM (Scanning Electron Microscope) photograph of a cross section of the ridge waveguide of the quantum cascade laser according to the first embodiment.

The layer that includes Al and is included in the quantum well region of the active layer 10 is replaced with the first regions 11 including Al oxide in regions reaching the prescribed depth L2 inward from the two outer edges 10b and 10c of the active layer 10. In oxide also may be generated if the layer including Al is an InAlAs layer. The layer that includes Al oxide is used as a current confinement region. The drawing is a cross section of the ridge waveguide 60 having undergone steam oxidation at an atmosphere temperature of 460° C. for 8 hours. The oxidization progresses and generates gaps 15 in a portion of the current confinement region; but the optical characteristics are not affected.

FIG. 5A is a Bright-field-STEM photograph of the cross section; FIG. 5B is a figure showing oxygen analysis using EDX; FIG. 5C is a figure showing Al analysis using EDX; FIG. 5D is a figure illustrating Ga analysis using EDX; FIG. 5E is a figure illustrating As analysis using EDX; and FIG. 5F is a figure illustrating In analysis using EDX.

EDX (Energy Dispersive X-ray Spectroscopy) is a method of performing composition analysis by detecting characteristic X-rays generated by electron beam irradiation and by performing spectroscopy of the energy. Element distributions of O, Al, Ga, As, and In corresponding to the STEM photograph of FIG. 5A are measured. The fine gray stripes of FIG. 5B illustrate the existence of the O element. In FIG. 5E, the fine black stripes show that As is sparse; and the gray spreading portions show that As is plentiful. The wide gray portions including fine stripes in FIG. 5C illustrate the spreading of Al.

From these figures, it is considered that the fine gray stripe portions of FIG. 5B are included in the layer including Al oxide. There are also cases where it is difficult to detect the layer including Al oxide if the thickness is thin. Also, it is considered that the gaps 15 observed in the SEM photograph of FIG. 4 correspond to black portions where O, Al, Ga, As, and In do not exist.

Table 1 is an example of the results of elemental analysis using EDX at the vicinity of the outer edges 10a and 10b of the active layer 10.

TABLE 1

| ELEMENT | ATOMIC % |
| --- | --- |
| O | 12.4 |
| Al | 9.0 |
| Ga | 10.4 |
| As | 41.2 |
| In | 27.0 |
| Total | 100 |

TABLE 1-continued

| ELEMENT | ATOMIC % |
|---------|----------|

Table 2 is an example of the results of elemental analysis using EDX of the central portion vicinity of the active layer.

TABLE 2

| ELEMENT | ATOMIC % |
|---------|----------|
| O | 1.3 |
| Al | 9.0 |
| Ga | 9.8 |
| As | 49.3 |
| In | 30.6 |
| Total | 100 |

Because the Al oxide layer is formed at the vicinity of the outer edges 10b and 10c of the active layer 10, the O element atomic % is high, i.e., 12.4%. On the other hand, at the central portion vicinity of the active layer 10, the oxidization does not progress; and the oxygen element atomic % is low, i.e., 1.3%. The difference between Table 1 and Table 2 is small for the Al element atomic %, the Ga element atomic %, and the In element atomic %. Thus, it was ascertained from the composition analysis using EDX that the layer including Al oxide forms current confinement layers arranged regularly inside the active layer 10 to correspond to the composition of the quantum well structure.

Figure 6:
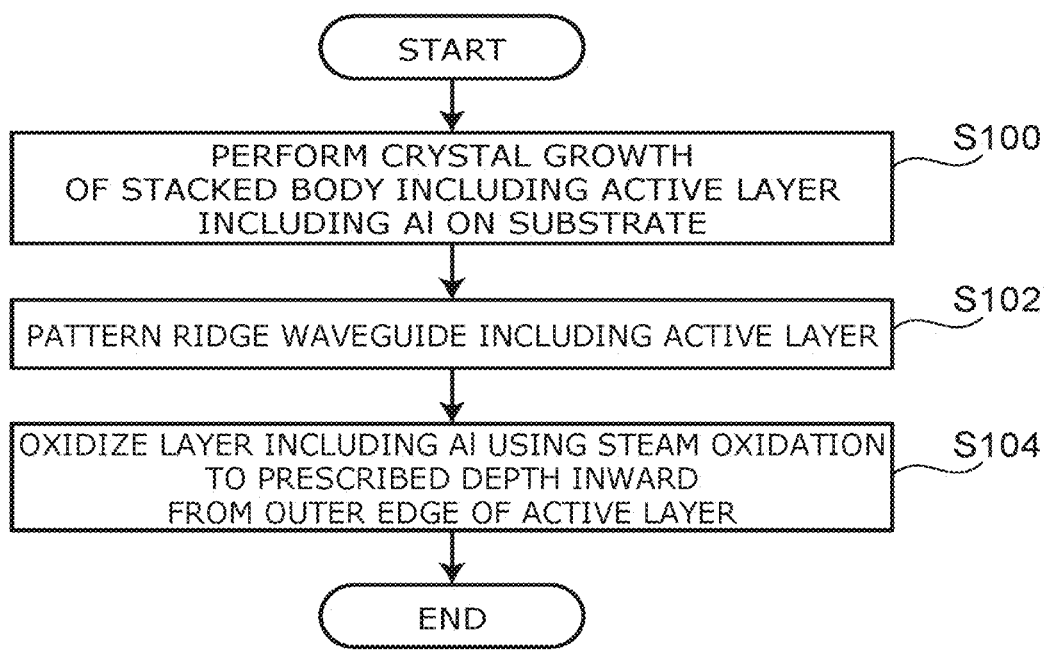
FIG. 6 is a flowchart describing a method for manufacturing the quantum cascade laser according to the first embodiment.

FIG. 6 is a flowchart describing a method for manufacturing the quantum cascade laser according to the first embodiment.

First, crystal growth of the semiconductor stacked body 5 including the active layer 10 including the quantum well region including the layer including Al is performed on the substrate 50 (S100). The crystal growth can include MOCVD (Metal Organic Chemical Vapor Deposition), MBE (Molecular Beam Epitaxy), etc.

Then, the semiconductor stacked body 5 is patterned using photolithography and dry etching, etc. Thereby, the ridge waveguide 60 that has the prescribed ridge width L1 and includes at least the active layer 10 of the semiconductor stacked body is formed (S102). In such a case, as illustrated in FIG. 4, in a cross section orthogonal to the optical axis 90, the outer edges 10b and 10c of the active layer 10 may be parallel or may define a shape that widens toward the substrate 50.

Then, oxidization of the quantum well region including the layer including Al is performed using steam oxidation to reach the prescribed depth L2 inward from the outer edges 10b and 10c of the active layer 10 (S104). The layer that includes Al becomes the first regions 11 including Al oxide and the second regions interposed between the first regions 11 that do not include Al oxide. For example, the steam oxidation causes the oxidization to progress at a prescribed temperature for a prescribed period of time in a water vapor atmosphere.

Subsequently, as illustrated in FIG. 1, the insulating film 62 is provided on the side surfaces 60a and 60b of the ridge waveguide 60 and on the surface of the substrate 50 where the ridge waveguide is not provided. The insulating film 62 can be $SiO_x$, etc. The upper electrode 64 can be provided on the upper surface 40a of the contact layer 40 and the upper portion of the insulating film 62; and the back electrode 70 can be provided on the back surface of the substrate 50.

Figure 7:
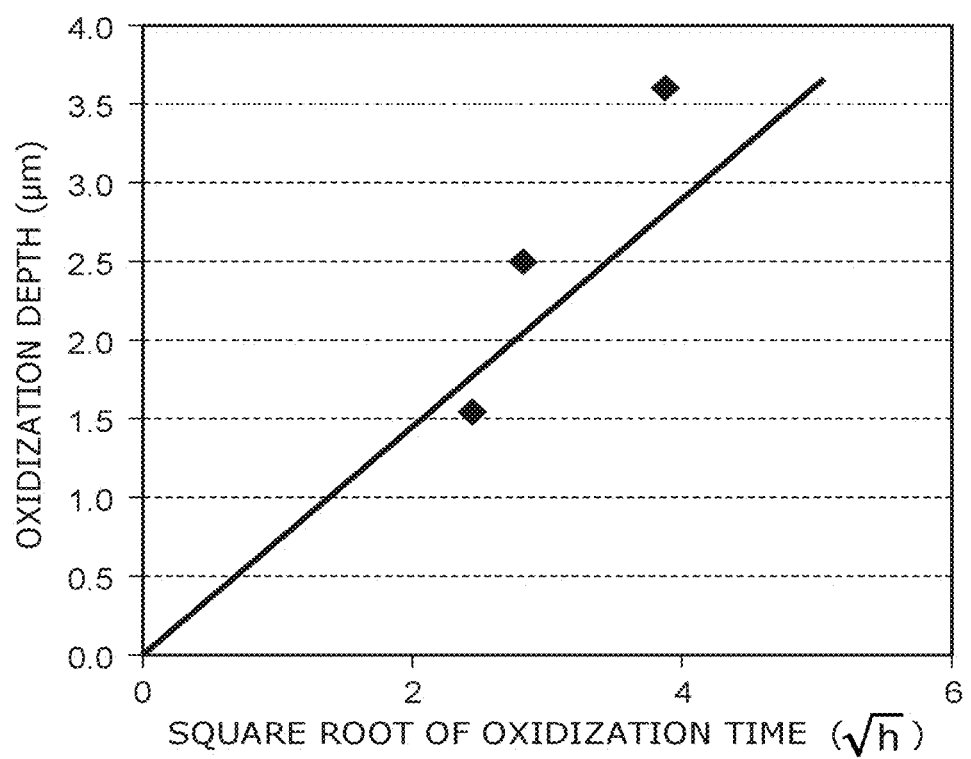
FIG. 7 is a graph illustrating the oxidization depth dependence for the square root of the oxidization time.

FIG. 7 is a graph illustrating the oxidization depth dependence for the square root of the oxidization time.

The vertical axis is the oxidization depth (μm); and the horizontal axis is the square root of the oxidization time ($h^{1/2}$). The layer that includes Al included in the quantum well included in the active layer 10 is taken to be $Al_{0.67}In_{0.33}As$. The atmosphere temperature was set to 460° C.; the oxidization time was set to 6 to 15 hours (h); and the water amount was set to 100 g/h. The oxidization depth increases monotonously with respect to the square root of the oxidization time.

It will now be described how the luminous efficiency does not decrease even when an oxidation confinement layer is provided inside the active layer in the quantum cascade laser.

Figure 8A:
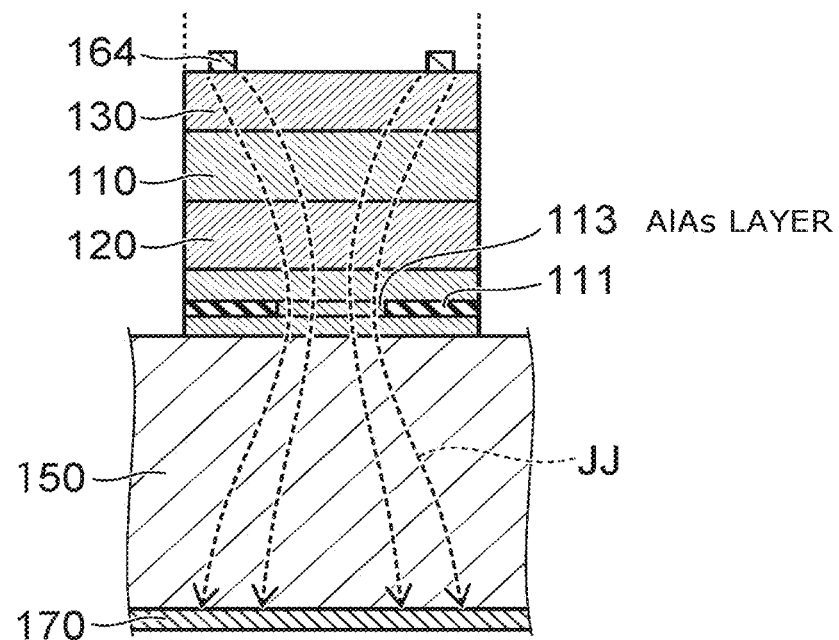
FIG. 8A is a schematic cross-sectional view of a p-n junction-type surface-emitting laser.
Figure 8B:
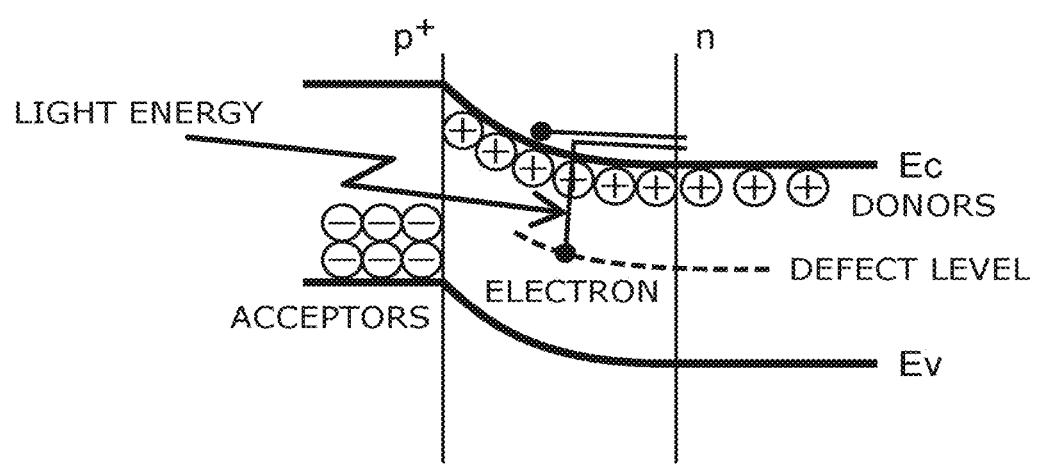
FIG. 8B is the energy level diagram of the laser.

FIG. 8A is a schematic cross-sectional view of a p-n junction-type surface-emitting laser; and FIG. 8B is the energy level diagram of the laser.

As illustrated in FIG. 8A, the p-n junction-type surface-emitting laser includes a back electrode 170, a substrate 150, an AlAs layer 113, an Al oxide layer 111, a lower cladding layer 120, an active layer 110, an upper cladding layer 130, an upper electrode 164, etc. As illustrated in FIG. 8B, the active layer 110 includes a quantum well region including several layers of wells. The holes and the electrons recombine in the quantum well layer region; and laser oscillation having a bandgap wavelength corresponding to the bandgap energy is generated.

The AlAs layer 113 is provided below the active layer 110 in the comparative example. The AlAs layer 113 is changed to a current confinement layer by being replaced with the layer 111 including Al oxide inward from the ridge outer edges. In such a case, when the oxidization of the layer including Al is performed, volume change and/or strain change occurs inside the layer. As a result, as illustrated in FIG. 8B, a defect level is generated inside the bandgap at the periphery of the quantum well region; non-radiative recombination occurs between the defect level and the carriers; and the luminous efficiency decreases. To suppress the decrease of the luminous efficiency in the p-n junction laser, the layer 111 that includes Al oxide is provided below and separated from the active layer 110. As a result, a current 33 cannot be confined sufficiently in the active layer 110; and the light confinement is insufficient.

Conversely, according to experiments by the inventors, in the first embodiment, the oxidation confinement does not affect the optical levels between the subbands of the conduction band. Therefore, the unfavorable effect of a defect level being generated inside the bandgap can be avoided; and light confinement is possible. As a result, it was ascertained that the decrease of the luminous efficiency is suppressed.

According to the embodiment, a quantum cascade laser and a method for manufacturing the quantum cascade laser are provided in which the ridge width can be reduced effectively and a high manufacturing yield is possible. This quantum cascade laser can obtain high-output laser light from infrared light to terahertz waves with a reduced threshold current. Wide applications are possible to highly-sensitive gas sensors, biomedical instruments, resin material processing machines, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A quantum cascade laser, comprising a semiconductor stacked body including an active layer and having a ridge waveguide provided in the semiconductor stacked body,
the active layer including a quantum well region and emitting laser light by an intersubband optical transition of a mono-carrier, the quantum well region including a layer including Al,
an optical axis of the laser light being parallel to an extension direction of the ridge waveguide,
the layer including Al including first regions and a second region, the first regions including Al oxide and reaching a prescribed depth along a direction inward from an outer edge of the active layer, the direction being parallel to a surface of the active layer in a cross section orthogonal to the optical axis, the second region being interposed between the first regions and not including Al oxide;
further comprising a substrate,
the semiconductor stacked body being provided on the substrate,
wherein in the cross section, outer edges of the active layer are parallel or cause the active layer to widen toward the substrate.

2. The laser according to claim 1, wherein the first regions are a current confinement layer.

3. The laser according to claim 2, further comprising a substrate, the semiconductor stacked body being provided on the substrate.

4. The laser according to claim 1, wherein the substrate includes InP.

5. The laser according to claim 1, wherein the quantum well region includes in the second region a well layer including InGaAs, and a barrier layer including AlInAs.

6. The laser according to claim 1, wherein an Al mole ratio of the second region of the quantum well region is a maximum among Al mole ratios of a plurality of layers included in the semiconductor stacked body.

* * * * *